(12) United States Patent
Lim (10) Patent No.: US 11,973,089 B2
(45) Date of Patent: Apr. 30, 2024

(54) DISPLAY APPARATUS

(71) Applicant: LG Display Co., Ltd., Seoul (KR)

(72) Inventor: Hyunsoo Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/076,980

(22) Filed: Dec. 7, 2022

(65) Prior Publication Data

US 2023/0097163 A1 Mar. 30, 2023

Related U.S. Application Data

(63) Continuation of application No. 17/124,883, filed on Dec. 17, 2020, now Pat. No. 11,552,112.

(30) Foreign Application Priority Data

Dec. 31, 2019 (KR) .......................... 10-2019-0179137

(51) Int. Cl.
| | |
|---|---|
| *H01L 27/12* | (2006.01) |
| *H10K 59/121* | (2023.01) |
| *H10K 59/122* | (2023.01) |

(52) U.S. Cl.
CPC ...... *H01L 27/1255* (2013.01); *H01L 27/1225* (2013.01); *H10K 59/1213* (2023.02); *H10K 59/122* (2023.02)

(58) Field of Classification Search
CPC ............. H01L 27/1255; H01L 27/1225; H01L 27/1251; H01L 27/1222; H01L 27/124; H01L 27/12; H01L 29/7869; H01L 29/786; H01L 29/42384; H01L 29/78648; H01L 29/66742; H01L 29/66477; H10K 59/1213; H10K 59/122; H10K 59/1216; H10K 50/80; H10K 50/81; H10K 50/822;
(Continued)

(56) References Cited

U.S. PATENT DOCUMENTS

| | | | |
|---|---|---|---|
| 9,786,697 B2 * | 10/2017 | Lee | ...................... H01L 27/1222 |
| 9,985,082 B2 * | 5/2018 | Lee | ...................... H10K 59/126 |
| 10,163,944 B2 | 12/2018 | Lee et al. | |

(Continued)

FOREIGN PATENT DOCUMENTS

| | | |
|---|---|---|
| CN | 106257677 A | 12/2016 |
| CN | 108172583 A | 6/2018 |

(Continued)

OTHER PUBLICATIONS

United States Office Action, U.S. Appl. No. 17/124,883, filed Jun. 1, 2022, 11 pages.

(Continued)

*Primary Examiner* — Nikolay K Yushin
(74) *Attorney, Agent, or Firm* — Fenwick & West LLP (57) ABSTRACT

The present disclosure provides a display device comprising: a first thin film transistor including a first semiconductor pattern disposed on a substrate and comprising poly-silicon, and a first gate electrode; a middle layer on the first gate electrode; a second thin film transistor including a second semiconductor pattern disposed on the middle layer and comprising an oxide semiconductor, and a second gate electrode; and a storage capacitor including first to fourth storage electrodes overlapping with each other.

20 Claims, 6 Drawing Sheets

(58) Field of Classification Search
CPC .......... H10K 50/8447; H10K 50/8445; H10K 50/824; H10K 59/121
See application file for complete search history.

(56) References Cited

U.S. PATENT DOCUMENTS

| | | | |
|---|---|---|---|
| 10,297,622 B2 | 5/2019 | Na et al. | |
| 10,553,727 B2 | 2/2020 | Bae et al. | |
| 10,811,445 B2 | 10/2020 | Murai | |
| 11,038,001 B2* | 6/2021 | Ueda | H10K 59/131 |
| 2009/0278121 A1 | 11/2009 | Kakkad et al. | |
| 2016/0372497 A1* | 12/2016 | Lee | H01L 27/1255 |
| 2018/0012913 A1 | 1/2018 | Lee et al. | |
| 2018/0012947 A1* | 1/2018 | Lee | H01L 27/1222 |
| 2018/0061868 A1 | 3/2018 | Na et al. | |
| 2018/0158848 A1 | 6/2018 | Murai | |
| 2018/0190824 A1 | 7/2018 | Bae et al. | |
| 2020/0020756 A1* | 1/2020 | Ueda | H10K 59/131 |

FOREIGN PATENT DOCUMENTS

| | | |
|---|---|---|
| CN | 108269760 A | 7/2018 |
| KR | 10-2016-0150199 A | 12/2016 |
| KR | 10-2018-0005580 A | 1/2018 |
| KR | 10-2019-0030840 A | 3/2019 |

OTHER PUBLICATIONS

China National Intellectual Property Administration, Office Action, Chinese Patent Application No. 202011537491.5, Dec. 11, 2023, 14 pages.

Korean Intellectual Property Office, Office Action, Korean Patent Application No. 10-2019-0179137, Jan. 2, 2024, 12 pages.

* cited by examiner

DISPLAY APPARATUS

CROSS REFERENCE TO RELATED APPLICATION

This application is a continuation of U.S. patent application Ser. No. 17/124,883 filed on Dec. 17, 2020, which claims priority from Republic of Korea Patent Application No. 10-2019-0179137, filed on Dec. 31, 2019, each of which is hereby incorporated by reference in its entirety.

BACKGROUND

1. Field of Technology

The present disclosure relates to a display device including a plurality of thin film transistors including different semiconductors.

2. Description of the Prior Art

As the information society develops, the demand for display devices for displaying images is increasing in various forms. Various types of display devices such as a liquid crystal display device (LCD), and an organic light emitting display device (OLED) have been used for this purpose.

Since the thin film transistor can be manufactured on a glass substrate or a plastic substrate, the thin film transistor is widely used as the driving element or the switching element for the display device such as the liquid crystal display device, the electroluminescence display device, or the like.

These display devices generally include a pair of substrates bonded to each other and a polarizing material or a light emitting material disposed between the pair of substrates, and at least one of the pair of substrates includes a plurality of pixels in a display area where an image is displayed. This region is defined as the pixel area and the display device may include the thin film transistor array substrate in which at least one thin film transistor is disposed in each pixel area.

For example, the thin film transistor array substrate may include the driving thin film transistor for supplying the driving current to the light emitting element in each pixel area and the switching thin film transistor for supplying the gate signal to the driving thin film transistor.

Meanwhile, in the thin film transistor array substrate of such a display device, the driving thin film transistor should be designed to be advantageous for gradation presentation, and the switching thin film transistor should be designed to have a good on/off ratio. This is because the driving thin film transistor is advantageous in the gradation presentation as the current change amount to the voltage change amount is small, and the switching thin film transistor should have a fast on-off characteristic.

However, in the general display device, the driving thin film transistor and the switching thin film transistor including the same semiconductor material implemented on the same substrate have the same characteristics. As a result, it is impossible to design different characteristics of the driving thin film transistor and the switching thin film transistor according to the characteristics of the thin film transistor with the structure of the conventional thin film transistor array substrate and the display device including the same.

SUMMARY

The higher the resolution of the display device, the smaller the area of each pixel area. Therefore, it is difficult to design a high-capacity storage capacitor and a plurality of transistors in each sub-pixel area. However, in the display device according to the embodiments of the present disclosure, by forming three or more storage capacitors configured of a plurality of storage electrodes overlapping with each other whiling forming the thin film transistors including different semiconductors, there is an advantage that the storage capacitor and a plurality of transistors can be effectively designed in each limited subpixel area, thereby it is capable of providing the high-capacity storage capacitor in the high-resolution display device.

In accordance with an aspect of the present disclosure, there may be provided with a display device comprising: a first buffer layer on a substrate; a first thin film transistor including a first semiconductor pattern disposed on the first buffer layer and comprising poly-silicon, a first gate electrode overlapping the first semiconductor pattern with a first gate insulation layer interposed therebetween, and a first source electrode and a first drain electrode connected to the first semiconductor pattern; a first interlayer insulation layer on the first gate electrode; a second buffer layer on the first interlayer insulation layer; a second thin film transistor including a second semiconductor pattern disposed on the second buffer layer and comprising an oxide semiconductor, a second source electrode and a second drain electrode on the second semiconductor pattern, and a second gate electrode overlapping the second source electrode and the second drain electrode with a second gate insulation layer therebetween; and a storage capacitor including a first storage electrode disposed on the first buffer layer and made of the same material as the first semiconductor pattern, a second storage electrode made of the same material as the first gate electrode and overlapping the first storage electrode with the first gate insulation layer interposed therebetween, a third storage electrode made of the same material as the second semiconductor pattern and overlapping the second storage electrode with the second buffer layer and the first interlayer insulation layer interposed therebetween, and a fourth storage electrode made of the same material as the second gate electrode and overlapping the third storage electrode with the second gate insulation layer interposed therebetween.

In accordance with another aspect of the present disclosure, there may be provided with a display device comprising: a first buffer layer on a substrate; a first thin film transistor including a first semiconductor pattern disposed on the first buffer layer and including a first semiconductor, a first gate electrode overlapping the first semiconductor pattern with a first gate insulation layer interposed therebetween, and a first source electrode and a first drain electrode connected to the first semiconductor pattern; a first interlayer insulation layer on the first gate electrode; a second buffer layer on the first interlayer insulation layer; a second thin film transistor including a second semiconductor pattern disposed on the second buffer layer and including a second semiconductor different from the first semiconductor, a second source electrode and a second drain electrode on the second semiconductor pattern, and a second gate electrode overlapping the second source electrode and the second drain electrode with a second gate insulation layer therebetween; and a storage capacitor including a first storage electrode disposed on the first buffer layer and made of the same material as the first semiconductor pattern, a second storage electrode made of the same material as the first gate electrode and overlapping the first storage electrode with the first gate insulation layer interposed therebetween, a third storage electrode made of the same material as the second semiconductor pattern and overlapping the second storage electrode with the second buffer layer and the first interlayer insulation layer interposed therebetween, and a fourth storage electrode made of the same material as the second gate electrode and overlapping the third storage electrode with the second gate insulation layer interposed therebetween.

In the display device according to the embodiments of the present disclosure, the first storage electrode formed on the same layer as the first semiconductor pattern and the second storage electrode formed on the same layer as the first gate electrode may overlap to form the first storage capacitor C1. In addition, the second storage electrode and the third storage electrode formed on the same layer as the second semiconductor pattern may overlap to form the second storage capacitor C2. In addition, the third storage electrode and the fourth storage electrode formed on the same layer as the second gate electrode may overlap to form the third storage capacitor C3. In addition, the fourth storage electrode and the fifth storage electrode formed on the same layer as the auxiliary electrode 610 may overlap to further form the fourth storage capacitor C4. Therefore, in the high-resolution display device requiring the high-capacity storage capacitor, there is an advantage that the storage capacitor and a plurality of transistors can be effectively designed in each limited subpixel area.

DETAILED DESCRIPTION

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear.

The terms such as "including", "having", "containing", "comprising of", and "consist of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

For example, when the positional relationship of two element is described using the terms of "on", "upper", "above", "below", "under", "beneath", "lower", "near", "close", "adjacent", it should be interpreted that one or more elements may be further "interposed" between the elements unless the terms such as "directly", "only" are used.

Spatially relative terms, such as, "below", "beneath", "lower", "above", "upper" may be used herein to describe one element or feature's relationship to another element(s) or feature(s) as illustrated in the figures. The spatially relative terms should be understood as terms including different directions of the element in use or operation in addition to the directions shown in the drawings. For example, if the element shown in the figure is turned over, an element described as "below" or "beneath" the other element may be placed "above" the other element. Accordingly, the exemplary term "below" can include both the directions below and above. Likewise, the exemplary terms "on" or "upper" can include both the upper and lower directions.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

It should be understood that the term "at least one" includes all possible combinations from one or more related items. For example, the meaning of "at least one of the first item, the second item, and the third item" may any combination of items that can be presented from more than two items of the first item, the second item and the third item, as well as the first item or the second item or the third item.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another.

In the embodiments of the present specification, the source electrode and the drain electrode are merely distinguished for convenience of description, and the source electrode and the drain electrode may be interchanged. The source electrode can be a drain electrode, and the drain electrode can be a source electrode. Further, the source electrode in one embodiment may be a drain electrode in another embodiment, and the drain electrode in one embodiment may be a source electrode in another embodiment.

In some embodiments of the present specification, for convenience of description, the source region and the source electrode are described to be distinguished, and the drain region and the drain electrode are also defined to be distinguished, but embodiments of the present specification are not limited thereto. The source region can be a source electrode, and the drain region can be a drain electrode. Further, the source region may be a drain electrode, or the drain region may be a source electrode.

Figure 1:
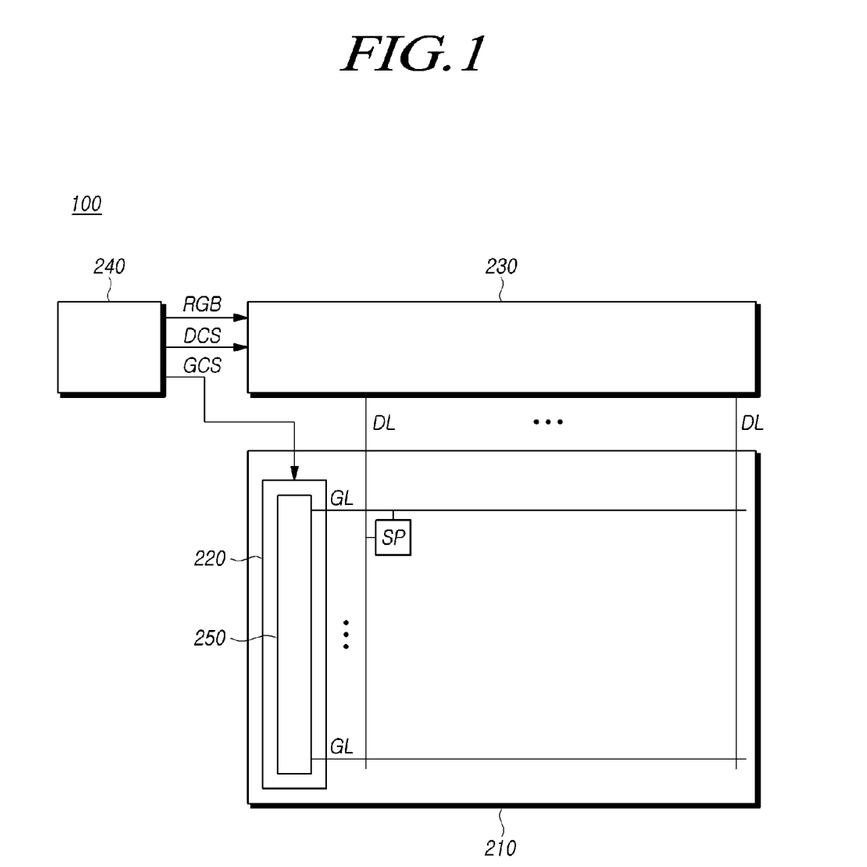
FIG. 1 is a diagram illustrating a schematic configuration of a display device according to an embodiment of the present disclosure.

FIG. 1 is a diagram illustrating a schematic configuration of the display device 100 according to an embodiment of the present disclosure.

Referring to FIG. 1, the display device 100 according to an embodiment of the present specification may include the display panel 210, the gate driver 220, the data driver 230, and the control unit 240.

The display panel 210 may include gate lines GL, data lines DL, and subpixels SP disposed in the crossing area of the gate lines GL and the data lines DL. The subpixel SP may include the light emitting element LED and the pixel driving circuit PDC for driving the light emitting element LED (not shown in FIG. 1). Images may be displayed on the display panel 210 by driving the subpixel SP.

The control unit 240 may control the gate driver 220 and the data driver 230.

The control unit 240 may output the gate control signal GCS for controlling the gate driver 220 and the data control signal DCS for controlling the data driver 230 by using the synchronization signal and the clock signal supplied from an external system (not shown). In addition, the control unit 240 may sample and rearrange the input image data input from the external system, and may supply the rearranged digital image data RGB to the data driver 230.

The gate control signal GCS may include a gate start pulse GSP, a gate shift clock GSC, a gate output enable signal GOE, a start signal Vst, and a gate clock GCLK (not shown). In addition, control signals for controlling the shift register 250 may be included in the gate control signal GCS.

The data control signal DCS may include a source start pulse SSP, a source shift clock signal SSC, a source output enable signal SOE, and a polarity control signal POL (not shown).

The data driver 230 may supply the data voltage to the data lines DL of the display panel 210. Specifically, the data driver 230 may convert the image data RGB input from the control unit 240 into the analog data voltage, and thus, may supply the data voltage corresponding to one horizontal line to the data lines DL for each horizontal period during which the gate pulse is supplied to the gate line GL.

The gate driver 220 may include a shift register 250.

The shift register 250 may sequentially supply the gate pulse GP to the gate lines GL for one frame by using the start signal Vst and the gate clock GCLK transmitted from the control unit 240. Here, one frame may refer to a period during which one image is output through the display panel 210. The gate pulse GP may include the turn-on voltage capable of turning on the switching element (thin film transistor) disposed in the subpixel SP.

In addition, the shift register 250 may supply the gate-off signal Goff capable of turning off the switching element in the gate line GL during one remaining period during which the gate pulse GP is not supplied in one frame. Hereinafter, the gate pulse GP and the gate-off signal Goff are collectively referred to as the scan signal SS(SCAN).

According to one embodiment of the present specification, the gate driver 220 may be mounted on the display panel 210. In this way, a structure in which the gate driver 220 is directly mounted on the display panel 210 may be referred to as a gate-in-panel (GIP) structure. The gate driver 220 may include at least one of the thin film transistors 300 and 400 illustrated in FIGS. 3 to 4.

Figure 2:
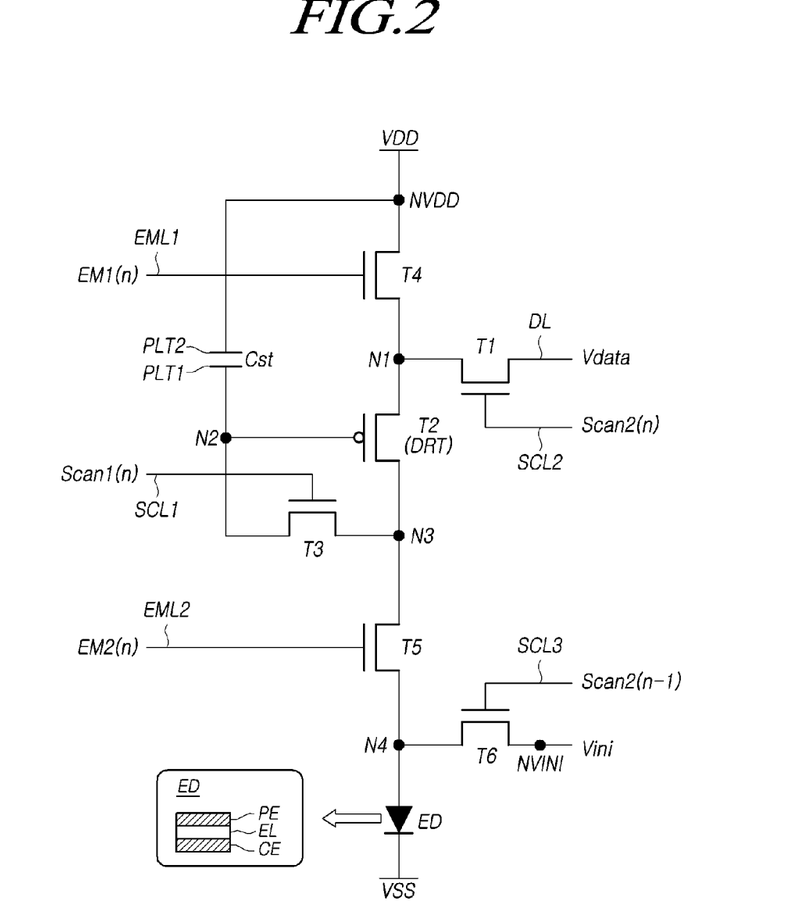
FIG. 2 is a circuit diagram of one subpixel of FIG. 1 according to an embodiment of the present disclosure.

FIG. 2 illustrates the equivalent circuit of the subpixel SP included in the display device 100 according to embodiments of the present specification.

Referring to FIG. 2, each subpixel SP may include a light emitting element ED, first to sixth transistors T1 to T6, and a storage capacitor Cst. That is, the subpixel SP shown in FIG. 2 is provided with a 6T1C structure, but the present disclosure is not limited thereto. For example, other structures of the subpixel SP, such as 2T1C, 3T1C, 4T1C, 3T2C, etc., may also be applicable to the embodiments of the present disclosure.

Referring to FIG. 2, each subpixel SP may include the main nodes including a first node N1 corresponding to a source node or a drain node of the second transistor T2 (DRT), a second node N2 corresponding to a gate node of the second transistor T2, a third node N3 corresponding to the drain node or the source node of the second transistor T2 and the fourth node N4 corresponding to the pixel electrode PE of the light emitting element ED.

The light emitting element ED may include the pixel electrode PE, the light emitting layer EL, and a common electrode CE. The light emitting layer EL is positioned between the pixel electrode PE and the common electrode CE. The pixel electrode PE and the light emitting layer EL are disposed for each subpixel SP. However, the common electrode CE may be commonly disposed in a plurality of subpixels SP. The base voltage VSS corresponding to the common voltage may be applied to the common electrode CE.

The second transistor T2 of the first to sixth transistors T1 to T6 may be a driving transistor DRT for driving the light emitting element ED.

Five gate lines GL are required, each of which is connected to the gate node of the remaining five transistors T1, T3, T4, T5, and T6 except for the second transistor T2 as the driving transistor DRT among the first to sixth transistors T1 to T6.

The five gate lines GL may include first to third scan lines SCL1, SCL2, and SCL3 and first and second light emission control lines EML1 and EML2.

The third transistor T3 may control the electrical connections between the second node N2 and the third node N3 according to the first scan signal Scan1($n$) applied to the gate node through the first scan line SCL1.

The first transistor T1 may control the electrical connections between the first node N1 and the data lines DL supplying the data voltage Vdata according to the second scan signal Scan2($n$) applied to the gate node through the second scan line SCL2.

The sixth transistor T6 may control the electrical connections between the fourth node N4 and the initialization voltage node NVINI supplying the initialization voltage Vini according to the third scan signal Scan2(n−1) applied to the gate node through the third scan line SCL3.

The fourth transistor T4 may control the electrical connections between the first node N1 and the driving voltage node NVDD to which the driving voltage VDD is applied according to the first light emission control signal EM1(n) applied to the gate node through the first light emission control line EML1.

The fifth transistor T5 may control the electrical connections between the third node N3 and the fourth node N4 according to the second light emission control signal EM2(n) applied to the gate node through the second light emission control line EML2.

Referring to FIG. 2, the storage capacitor Cst includes a first plate PLT1 and a second plate PLT2. The first plate PLT1 is electrically connected to the gate node of the second transistor T2 which is the driving transistor DRT, and the second plate PLT2 is electrically connected to the DC voltage node. Here, the DC voltage node may include, for example, a driving voltage node NVDD.

Referring to FIG. 2, the storage capacitor Cst may be electrically connected between the second node N2 and the driving voltage node NVDD. Here, the second node N2 may correspond to the gate node of the second transistor T2 which is the driving transistor DRT, and the driving voltage node NVDD may be the DC voltage node.

Referring to FIG. 2, the second transistor T2 of the first to sixth transistors T1 to T6 may be a P-type transistor. For example, the second transistor T2 of the first to sixth transistors T1 to T6 may be a P-type transistor, and the remaining first, third to sixth transistors T1, T3~T6 may be N-type transistors. However, the present invention is not limited thereto, and at least one of the first to sixth transistors T1 to T6 may be an N-type transistor, and all other transistors may be P-type transistors. Alternatively, all of the first to sixth transistors T1 to T6 may be N-type transistors.

As described above, by designing the second transistor T2 as the driving transistor DRT as a P-type transistor, the storage capacitor Cst may be formed between the second node N2 as the gate node of the second transistor T2 and the driving voltage node NVDD that is the DC voltage node.

One of both ends of the storage capacitor Cst is connected to the driving voltage node NVDD which is the DC voltage node, thereby preventing the voltage change of the second node N2 which is the other of the both ends of the storage capacitor Cst. The second node N2 corresponds to the gate node of the second transistor T2 as the driving transistor DRT.

In addition, according to the embodiments of the present specification, the second transistor T2 as the driving transistor DRT may be designed as the P-type transistor that is advantageous for operation reliability and current supply performance because operation reliability and current supply performance are most important. However, the remaining first, third to sixth transistors T1, T3~T6 may be transistors in which switching speed is more important than current supply performance. Therefore, the first, third to sixth transistors T1, T3~T6 may be designed as N-type transistors having a fast switching speed due to high carrier mobility. Accordingly, driving performance of the subpixel SP can be greatly improved.

Meanwhile, the display device 100 according to the embodiments of the present specification may be a self-luminescence display such as an organic light emitting diode (OLED) display, a quantum dot (QD) display, or a micro LED (Light Emitting Diode) display. However, the present disclosure is not limited thereto, and the display device according to the embodiments of the present specification may also be a liquid crystal display device (LCD), etc.

In the case that the display device 100 according to the embodiments of the present specification is the OLED display, each subpixel SP may include an organic light emitting diode (OLED) that emits light as the light emitting element ED. When the display device 100 according to the embodiments of the present specification is the quantum dot display, each subpixel SP may include the light emitting element ED made of a quantum dot which is a semiconductor crystal emitting light itself. When the display device 100 according to the embodiments of the present specification is the micro LED display, each subpixel SP may include the micro light emitting diode which is made of an inorganic material and emits light itself as the light emitting element ED.

Figure 3A:
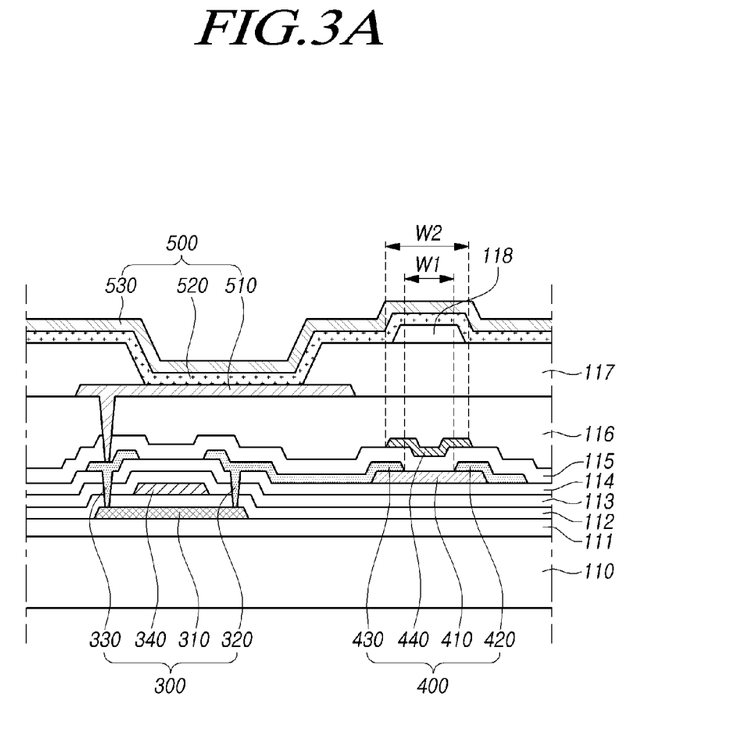
FIG. 3A is a cross-sectional view of a plurality of thin film transistors and a light emitting element in the subpixel according to an embodiment of the present disclosure.
Figure 3B:
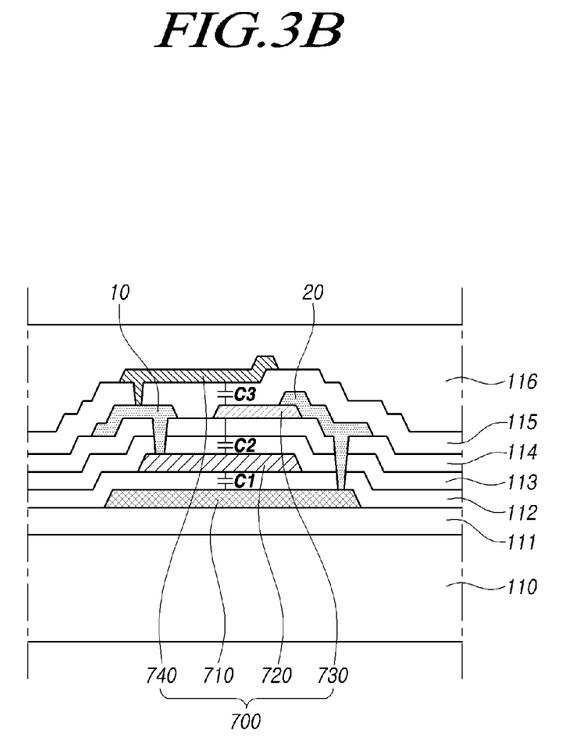
FIG. 3B is a cross-sectional view of the storage capacitor in the subpixel according to an embodiment of the present disclosure.

FIG. 3A is a cross-sectional view illustrating the plurality of thin film transistors and light emitting elements in the subpixel of the display device according to an exemplary embodiment of the present specification. FIG. 3B is a cross-sectional view illustrating the storage capacitor in a subpixel of the display device according to the embodiment of the present specification. Referring to FIGS. 3A and 3B, the display device according to an embodiment of the present specification may include a substrate 110, a first buffer layer 111, a first gate insulation layer 112, a first interlayer insulation layer 113, and a second buffer layer 114, a second gate insulation layer 115, a protective layer 116, a bank layer 117, a spacer 118, the light emitting element 500, a first connection electrode 10, a second connection electrode 20, the first thin film transistor 300, the second thin film transistor 400 and the storage capacitor 700. However, the present disclosure is not limited thereto. For example, the first buffer layer 111 and/or the second buffer layer 114 may be omitted, and the first interlayer insulation layer 113 and a second buffer layer 114 may be collectively referred to as a middle layer.

The first thin film transistor 300 may include a first semiconductor pattern 310, a first source electrode 320, a first drain electrode 330, and a first gate electrode 340. Also, the second thin film transistor 400 may include a second semiconductor pattern 410, a second source electrode 420, a second drain electrode 430, and a second gate electrode 440. In addition. The storage capacitor 700 may include a first storage electrode 710, a second storage electrode 720, a third storage electrode 730, and a fourth storage electrode 740.

In addition, the light emitting element 500 may include a first electrode 510, a light emitting structure 520, and a second electrode 530.

Referring to FIG. 3A, the display device according to an embodiment of the present specification may include the substrate 110. The substrate 110 may include a display area in which subpixels SP are disposed and a non-display area disposed adjacent to the display area. The substrate 110 may include an insulating material. For example, the substrate 110 may include glass or plastic. In FIGS. 3A and 3B, the substrate 110 is illustrated as a single layer structure, but is not limited thereto. For example, the substrate 110 may have a multi-layer structure. The substrate 110 may have a structure in which an inorganic insulation layer is positioned between the first substrate layer and the second substrate layer. The second substrate layer may include the same material as the first substrate layer. For example, the first substrate layer and the second substrate layer may include plastic. The inorganic insulation layer may include an insulating material. For example, the first substrate layer and the second substrate layer may be made of polyimide (PI). In addition, the inorganic insulation layer may be formed of a single layer of silicon nitride (SiNx) or silicon oxide (SiOx) or multiple layers thereof. For example, an inorganic insulation layer may be formed of silica or silicon dioxide (SiO2) material.

In this way, by forming the inorganic insulation layer between the first substrate layer and the second substrate layer made of polyimide (PI), the electric charge charged to the lower first substrate layer may be blocked, thereby improving the reliability of the display device. In addition, by forming the inorganic insulation layer between the two polyimides (PI), it is possible to improve the reliability of the display device by blocking the moisture component from penetrating into the thin film transistor through the lower first substrate layer.

The substrate 110 may include pixels or subpixels SP defined by the gate lines GL and the data lines DL. The first thin film transistor 300, the second thin film transistor 400, and the light emitting element 500 may be positioned in each subpixel SP. Each light emitting element 500 may be electrically connected to the first thin film transistor 300 so as to emit light having a specific color. As another example, each light emitting element 500 may be electrically connected to the second thin film transistor 400 to emit light having a specific color.

Referring to FIG. 3A, the first buffer layer 111 may be formed on the substrate 110. The first buffer layer 111 may reduce contamination by the substrate 110 in the process of forming the pixel circuit. For example, the first buffer layer 111 may be formed between the substrate 110 and the first semiconductor pattern 310 of each subpixel SP. The first buffer layer 111 may include the insulating material. For example, the first buffer layer 111 may include a silicon oxide (SiOx) based material layer and a silicon nitride (SiNx) based material layer. The first buffer layer 111 may have a multi-layer structure. For example, the first buffer layer 111 may include a first buffer lower layer and a first buffer upper layer.

The first buffer lower layer may be disposed on the substrate 110, and the first buffer upper layer may be disposed on the first buffer lower layer. The first buffer lower layer may be formed of multiple layers of the silicon nitride (SiNx) based material layer and the silicon oxide (SiOx) based material layer. For example, the first buffer lower layer may be formed of the multi-layer in which a silicon oxide (SiOx) layer and a silicon nitride (SiNx) layer are alternately formed.

In addition, the first buffer upper layer may be formed of a single layer made of a silicon oxide (SiOx) based material. For example, the first buffer upper layer may be formed of a single layer made of silicon dioxide (SiO$_2$) material.

Referring to FIG. 3A, the first semiconductor pattern 310 may be positioned on the first buffer layer 111. The first semiconductor pattern 310 may include a semiconductor material. For example, the first semiconductor pattern 310 may include poly-silicon (Poly-Si) which is a polycrystalline semiconductor material. For example, the first semiconductor pattern 310 may include low temperature poly-silicon (LTPS).

In addition, referring to FIG. 3B, the first storage electrode 710 may be formed on the first buffer layer 111. The first storage electrode 710 and the first semiconductor pattern 310 may be made of the same material and may be disposed on the same layer.

The first gate insulation layer 112 may be formed on the first storage electrode 710, the first semiconductor pattern 310, and the first buffer layer 111. The first gate insulation layer 112 may include an insulating material. For example, the first gate insulation layer 112 may include a silicon oxide (SiOx) based material. For example, silicon dioxide (SiO2) may be included in the silicon oxide (SiOx) based material. However, the present disclosure is not limited thereto, and the first gate insulation layer 112 may include a silicon nitride (SiNx) based material. Alternatively, the first gate insulation layer 112 may be formed of multiple layers of a silicon nitride (SiNx) based material layer and a silicon oxide (SiOx) based material layer.

Referring to FIG. 3A, the first gate electrode 340 of the first thin film transistor 300 may be formed on the first gate insulation layer 112. The first gate electrode 340 may overlap the first semiconductor pattern 310 with the first gate insulation layer 112 interposed therebetween. The first gate electrode 340 may be insulated from the first semiconductor pattern 310 by the first gate insulation layer 112. The first gate electrode 340 may include a conductive material. For example, the first gate electrode 340 may include a metal such as aluminum (Al), chromium (Cr), copper (Cu), titanium (Ti), molybdenum (Mo), tungsten (W), or alloys thereof. Also, the first gate electrode 340 may be formed of a single layer made of a metal or alloy material or multiple layers thereof.

In addition, referring to FIG. 3B, the second storage electrode 720 may be formed on the first gate insulation layer 112. The second storage electrode 720 may overlap the first storage electrode 710 with the first gate insulation layer 112 interposed therebetween. The first storage capacitor C1 may be formed by overlapping the second storage electrode 720 and the first storage electrode 710. The second storage electrode 720 may be made of the same material as the first gate electrode 340 and may be disposed on the same layer. In addition, the second storage electrode 720 may have the same stacked structure as the first gate electrode 340.

The first interlayer insulation layer 113 may be formed on the second storage electrode 720, the first gate electrode 340, and the first gate insulation layer 112. The first interlayer insulation layer 113 may include the insulating material. The first interlayer insulation layer 113 may include a different material from the first gate insulation layer 112. For example, when the first gate insulation layer 112 includes a silicon oxide based material (SiOx), the first interlayer insulation layer 113 may include the silicon nitride based material (SiNx). However, the present invention is not limited thereto, and the first interlayer insulation layer 113 may be formed of multiple layers of the silicon nitride based material (SiNx) layer and the silicon oxide based material (SiOx) layer.

The second buffer layer 114 may be formed on the first interlayer insulation layer 113. The second buffer layer 114 may be formed of multiple layers of the silicon nitride (SiNx) based material layer and the silicon oxide (SiOx) based material layer. The second buffer layer 114 may be formed of multiple layers in which the silicon oxide (SiOx) and silicon nitride (SiNx) are alternatively formed. When the second buffer layer 114 is formed of multiple layers, the uppermost layer contacting the second semiconductor pattern 410 of the second thin film transistor 400 and the third storage electrode 730 of the storage capacitor 700 may be the silicon oxide (SiOx) layer. However, the present invention is not limited thereto, and the second buffer layer 114 may be formed of a single layer of silicon nitride (SiNx) or silicon oxide (SiOx).

Referring to FIG. 3A, the second semiconductor pattern 410 of the second thin film transistor 400 may be formed on the second buffer layer 114. The second semiconductor pattern 410 of the second thin film transistor 400 may include a different material from the first semiconductor pattern 310 of the first thin film transistor 300. The second semiconductor pattern 410 may include an oxide semiconductor. For example, the second semiconductor pattern 410 may include at least one material of IZO (InZnO), IGO (InGaO), ITO(InSnO), IGZO(InGaZnO), IGZTO(InGaZnSnO), ITZO(InSnZnO), IGTO(InGaSnO), GO(GaO), GZTO(GaZnSnO) or GZO(GaZnO)-based oxide semiconductor material. However, embodiments of the present disclosure are not limited thereto, and the second semiconductor pattern 410 may be made by other oxide semiconductor materials known in the art. Although the poly-silicon and the oxide semiconductor are exemplified as two different semiconductor material of the first and second thin film transistors, but the present disclosure is not limited thereto. Any other combination of two different semiconductor materials may also applicable to the present disclosure, if it can design different characteristics of the first and second thin film transistors as desired.

In addition, referring to FIG. 3B, the third storage electrode 730 may be formed on the second buffer layer 114. The third storage electrode 730 may overlap the second storage electrode 720 with the second buffer layer 114 and the first interlayer insulation layer 113 interposed therebetween. The third storage electrode 730 may overlap the second storage electrode 720 to form the second storage capacitor C2. The third storage electrode 730 is made of the same material as the second semiconductor pattern 410 and may be disposed on the same layer. In addition, the third storage electrode 730 may have a stacked structure identical to that of the second semiconductor pattern 410.

Referring to FIG. 3A, the contact hole exposing the first semiconductor pattern 310 of the first thin film transistor 300 may be formed by etching the second buffer layer 114, the first interlayer insulation layer 113, and the first gate insulation layer 112.

In addition, referring to FIG. 3B, the contact hole exposing the first storage electrode 710 may be formed by etching the second buffer layer 114, the first interlayer insulation layer 113 and the first gate insulation layer 112. In addition, a contact hole exposing the second storage electrode 720 may be formed by etching the second buffer layer 114 and the first interlayer insulation layer 113.

Referring to FIG. 3A, the first source electrode 320, the first drain electrode 330, the second source electrode 420 and the second drain electrode 430 may be formed on the second buffer layer 114 and the second semiconductor pattern 410.

The second source electrode 420 and the second drain electrode 430 of the second thin film transistor 400 may be connected to the second semiconductor pattern 410. The second source electrode 420 may overlap one side of the second semiconductor pattern 410. In addition, the second drain electrode 430 may overlap the other side of the second semiconductor pattern 410. For example, the second source electrode 420 may contact the upper surface of one side of the second semiconductor pattern 410. Also, the second drain electrode 430 may contact the upper surface of the other side of the second semiconductor pattern 410. The second source electrode 420 and the second drain electrode 430 may be disposed to be spaced apart from each other on the upper surface of the second semiconductor pattern 410. As illustrated in FIG. 3A, the second drain electrode 430 may contact and overlap the upper surface and side surface of the other side of the second semiconductor pattern 410. The second source electrode 420 may contact and overlap with the upper surface and side surfaces of one side of the second semiconductor pattern 410.

The first source electrode 320 and the first drain electrode 330 of the first thin film transistor 300 may be connected to the first semiconductor pattern 310 through the contact hole formed in the second buffer layer 114, a first interlayer insulation layer 113 and the first gate insulation layer 112.

The second source electrode 420, the second drain electrode 430, the first source electrode 320, and the first drain electrode 330 may be formed of the same material and have the same stacked structure. Also, these electrodes may be formed of a single layer or multiple layers made of any one of molybdenum (Mo), copper (Cu), titanium (Ti), aluminum (Al) chromium (Cr), gold (Au), nickel (Ni), neodymium (Nd) or alloys thereof. For example, when the second source electrode 420, the second drain electrode 430, the first source electrode 320, and the first drain electrode 330 are formed in a multi-layer structure, the second source electrode 420, the second drain electrode 430, the first source electrode 320, and the first drain electrode 330 may be formed of a triple layer. When the second source electrode 420, the second drain electrode 430, the first source electrode 320, and the first drain electrode 330 are formed in the triple layer, the lower layer and the upper layer may be formed of an aluminum (Al) metal layer. Further, the intermediate layer positioned between the lower layer and the upper layer may be formed of a titanium (Ti) metal layer.

The second drain electrode 430 of the second thin film transistor 400 and the first source electrode 320 of the first thin film transistor 300 may be formed as the integral type connected to each other. As another example, the second source electrode 420 of the second thin film transistor 400 and the first source electrode 320 of the first thin film transistor 300 may be formed integrally with each other.

Referring to FIG. 3B, the first connection electrode 10 and the second connection electrode 20 may be formed on the second buffer layer 114. The first connection electrode 10 may be connected to the second storage electrode 720. The first connection electrode 10 may be connected to the second storage electrode 720 exposed through the contact hole of the second buffer layer 114 and the first interlayer insulation layer 113. In addition, the second connection electrode 20 may overlap one side of the third storage electrode 730. For example, the second connection electrode 20 may contact the upper surface of one side of the third storage electrode 730.

In addition, the second connection electrode 20 may be connected to the first storage electrode 710 exposed through the contact hole formed in the second buffer layer 114, the first interlayer insulation layer 113 and the first gate insulation layer 112. Therefore, the second connection electrode 20 may serve to electrically connect the third storage electrode 730 and the first storage electrode 710. In addition, the first connection electrode 10 may serve to electrically connect the second storage electrode 720 and the fourth storage electrode 740.

The first connection electrode 10 and the second connection electrode 20 may be made of the same material as the second source electrode 420, the second drain electrode 430, the first source electrode 320 and the first drain electrode 330, and may have the same laminated structure.

Referring to FIGS. 3A and 3B, the second gate insulation layer 115 may be formed on the second source electrode 430, the second drain electrode 430, the first source electrode 320, the first drain electrode 330, the first connection electrode 10, and the second connection electrode 20. The second gate insulation layer 115 may include the insulating material. For example, the second gate insulation layer 115 may include at least one of a silicon oxide (SiOx) material and a silicon nitride (SiNx) material. The second gate insulation layer 115 may be formed as a single layer or multi-layer structure. The second gate insulation layer 115 may include a contact hole exposing the first drain electrode 330 of the first thin film transistor 300. In addition, the second gate insulation layer 115 may include a contact hole exposing the first connection electrode 10.

Referring to FIG. 3A, the second gate electrode 440 may be formed on the second gate insulation layer 115.

The second gate electrode 440 may overlap the second semiconductor pattern 410 with the second gate insulation layer 115 interposed therebetween. The second gate electrode 440 may include a conductive material. For example, the second gate electrode 440 may include a metal such as aluminum (Al), chromium (Cr), copper (Cu), titanium (Ti), molybdenum (Mo), tungsten (W), or alloys thereof. Also, the second gate electrode 440 may be formed of a single layer or multiple layers. For example, when the second gate electrode 440 is formed of multiple layers, the second gate electrode 440 may be formed of multiple layers of a molybdenum (Mo) metal layer and a titanium (Ti) metal layer. If the second gate electrode 440 is the multiple layer consisting of the molybdenum (Mo) metal layer and the titanium (Ti) metal layer, the width of the titanium (Ti) metal layer may be greater than the width of the molybdenum (Mo) metal layer based on a cross-sectional view.

In addition, the second gate electrode 440 may be made of the same material as the fourth storage electrode 740 and may be disposed on the same layer. Therefore, the second gate electrode 440 may have the same stacked structure as the fourth storage electrode 740.

In addition, the second source electrode 420 and the second drain electrode 430 may be disposed between the second gate electrode 440 and the second semiconductor pattern 410. The second source electrode 420 and the second drain electrode 430 may be disposed spaced apart from each other on the second semiconductor pattern 410. Also, based on the cross-sectional view, the width W2 of the second gate electrode 440 may be greater than the spacing distance W1 between the second source electrode 420 and the second drain electrode 430. Accordingly, the second gate electrode 440 may cover a region where the second source electrode 420 and the second drain electrode 430 are separated.

Referring to FIG. 3B, the fourth storage electrode 740 may be formed on the second gate insulation layer 115. The fourth storage electrode 740 may be connected to the first connection electrode 10 exposed through the contact hole of the second gate insulation layer 115. Accordingly, the fourth storage electrode 740 may be electrically connected to the second storage electrode 720. The fourth storage electrode 740 may overlap the third storage electrode 730 with the second gate insulation layer 115 therebetween. Therefore, the fourth storage electrode 740 may overlap the third storage electrode 730 to form the third storage capacitor C3. The fourth storage electrode 740 may be made of the same material as the second gate electrode 440 and may have the same stacked structure. Also, the fourth storage electrode 740 may be disposed on the same layer as the second gate electrode 440.

In the display device according to the embodiment of the present specification, the first storage electrode 710 formed on the same layer as the first semiconductor pattern 310 may overlap the second storage electrode formed on the same layer as the first gate electrode 340 to form the first storage capacitor C1. Also, the third storage electrode 730 formed on the same layer as the second semiconductor pattern 410 may overlap the second storage electrode 720 to further form the second storage capacitor C2. In addition, the third capacitor electrode 730 and the fourth storage electrode 740 formed on the same layer as the second gate electrode 440 may overlap with each other to further form the third storage capacitor C3. Accordingly, in the high-resolution display device requiring the high-capacity storage capacitor, there may be an advantage that the storage capacitor and the plurality of transistors can be effectively designed in each limited subpixel region.

Referring to FIGS. 3A and 3B, the protective layer 116 may be formed on the second gate insulation layer 115, the fourth storage electrode 740 and the second gate electrode 440. A contact hole for exposing the first drain electrode 330 of the first thin film transistor 300 may be formed in the protective layer 116. However, the present disclosure is not limited thereto, and a contact hole for exposing the second drain electrode 430 or the second source electrode 420 of the second thin film transistor 400 may be formed in the protective layer 116. The protective layer 116 may be a single layer or multiple layers made of at least one of inorganic and organic materials. When the protective layer 116 includes the inorganic material, the inorganic material may be a silicon oxide (SiOx) based material or a silicon nitride (SiNx) based material. In addition, when the protective layer 116 contains an organic material, the organic material may include an acrylic resin, an epoxy resin, a phenolic resin, a polyamide resin, or a polyimide resin.

In addition, when the protective layer 116 is formed of multiple layers, the protective layer 116 may be formed of a first organic layer and a second organic layer. Further, the first organic layer and the second organic layer may be made of different materials or the same material. As another example, the protective layer 116 may be formed of a first inorganic layer and a second inorganic layer. In addition, the first inorganic layer and the second inorganic layer may be made of different materials. Alternatively, the protective layer 116 may be formed of an inorganic layer and an organic layer. At this time, the inorganic layer may be a single layer or multiple layers.

The first electrode 510 of the light emitting element 500 may be formed on the protective layer 116. The first electrode 510 may be connected to the first drain electrode 330 of the first thin film transistor 300 through the contact hole of the protective layer 116.

Therefore, the light emitting element 500 of each subpixel SP may be electrically connected to the first thin film transistor 300 of the corresponding subpixel SP. For example, the first electrode 510 of each subpixel SP may pass through the protective layer 116 and be electrically connected to the first drain electrode 330 of the first thin film transistor 300. Accordingly, the first electrode 510 of each subpixel SP may be electrically connected to the first thin film transistor 300. However, the present disclosure is not limited thereto, and the first electrode 510 of the light emitting element 500 may be connected to the second thin film transistor 400.

The first electrode 510 may be formed of a multiple layer structure including a transparent conductive film and an opaque conductive film having high reflection efficiency. The transparent conductive film may be formed of a material having a relatively large work function value such as indium-tin-oxide (ITO) or indium-zinc-oxide (IZO). In addition, the opaque conductive film may be formed as a single layer or multi-layer structure including aluminum (Al), silver (Ag), copper (Cu), lead (Pb), molybdenum (Mo), titanium (Ti) or an alloy thereof. For example, the first electrode 510 may be formed of the transparent conductive film, the opaque conductive film, and the transparent conductive film sequentially. However, the present disclosure is not limited thereto, and for example, the transparent conductive film and the opaque conductive film may be sequentially formed.

Since the display device according to the exemplary embodiment of the present specification is a top emission display device, the first electrode 510 may be an anode electrode. If the display device is a bottom emission, the first electrode 510 disposed on the protective layer 116 may be a cathode electrode.

The light emitting element 500 of each subpixel SP may be independently driven. For example, the first electrode 510 of each subpixel SP may be insulated from the first electrode 510 of the adjacent subpixel SP. The edge of each first electrode 510 may be covered by the bank layer 117. The bank layer 117 may be positioned on the protective layer 116. The light emitting layer 520 and the second electrode 530 of each subpixel SP may be stacked on the corresponding first electrode 510 exposed by the bank layer 117. The bank layer 117 may include an insulating material. For example, the bank layer 117 may include an organic insulating material. The bank layer 117 may include the same material or a different material from the protective layer 116. The bank layer 117 may define a light emitting region of the display device, and thus may be referred to as a pixel defining film. A spacer 118 may be further disposed on the bank layer 117. In addition, the spacer 118 may be formed of the same material as the bank layer 117.

In addition, the light emitting layer 520 of the light emitting element 500 may be further disposed on the first electrode 510. The light emitting layer 520 may be formed on the first electrode 510 in the order of the hole layer HL, the light emitting material layer EML, and the electron layer EL or in the reverse order.

At least a portion of the light emitting layer 520 of each subpixel SP may extend onto the bank layer 117. For example, the hole layer HL and the electron layer EL of each subpixel SP may be connected to the hole layer HL and the electron layer EL of the adjacent subpixel SP. The light emitting material layer EML of each subpixel SP may be spaced apart from the emitting material layer EML of the adjacent subpixel SP. The second electrode 530 of each subpixel SP may extend on the bank layer 117. For example, the second electrode 530 of each subpixel SP may be connected to the second electrode 530 of the adjacent subpixel SP.

On the second electrode 530, an encapsulation member for inhibiting moisture penetration may be further disposed. The encapsulation member may include a first encapsulation layer, a second encapsulation layer, and a third encapsulation layer. The second encapsulation layer may include different materials from the first encapsulation layer and the third encapsulation layer. For example, the first encapsulation layer and the third encapsulation layer may be inorganic insulating films formed of an inorganic insulating material, and the second encapsulation layer may be organic insulating film formed of an organic insulating material. The first encapsulation layer of the encapsulation member may be disposed on the second electrode 530. In addition, the second encapsulation layer may be disposed on the first encapsulation layer. Further, the third encapsulation layer may be disposed on the second encapsulation layer.

The first encapsulation layer and the third encapsulation layer of the encapsulation member may be formed of an inorganic material such as silicon nitride (SiNx) or silicon oxide (SiOx). The second encapsulation layer of the encapsulation member may be made of organic materials such as acrylic resin, epoxy resin, phenolic resin, polyamide resin, and polyimide resin.

Figure 4A:
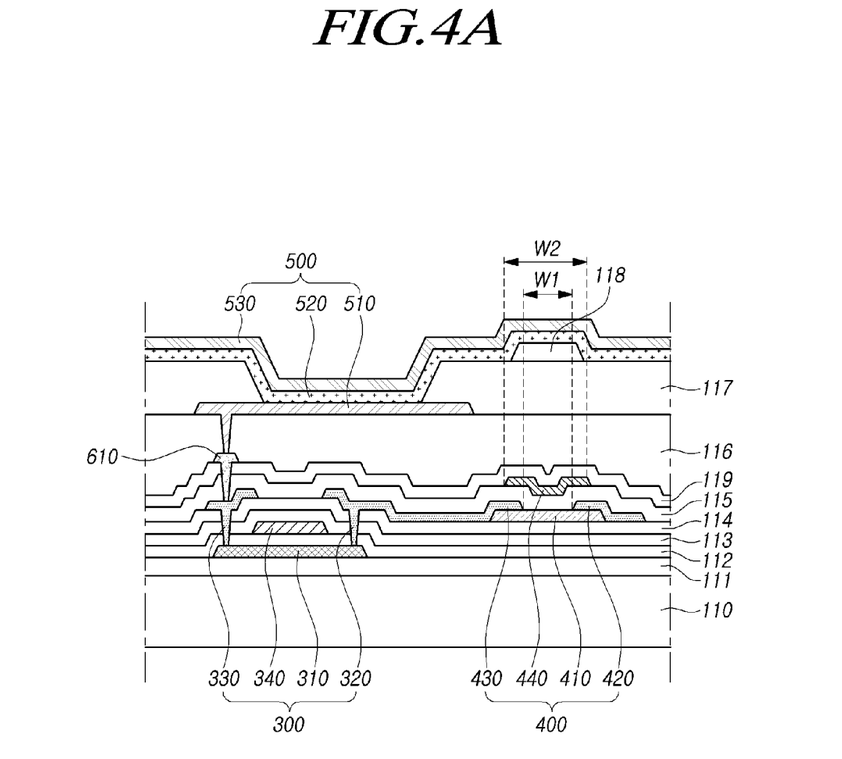
FIG. 4A is a cross-sectional view of a plurality of thin film transistors and a light emitting element in the subpixel according to another embodiment of the present disclosure.
Figure 4B:
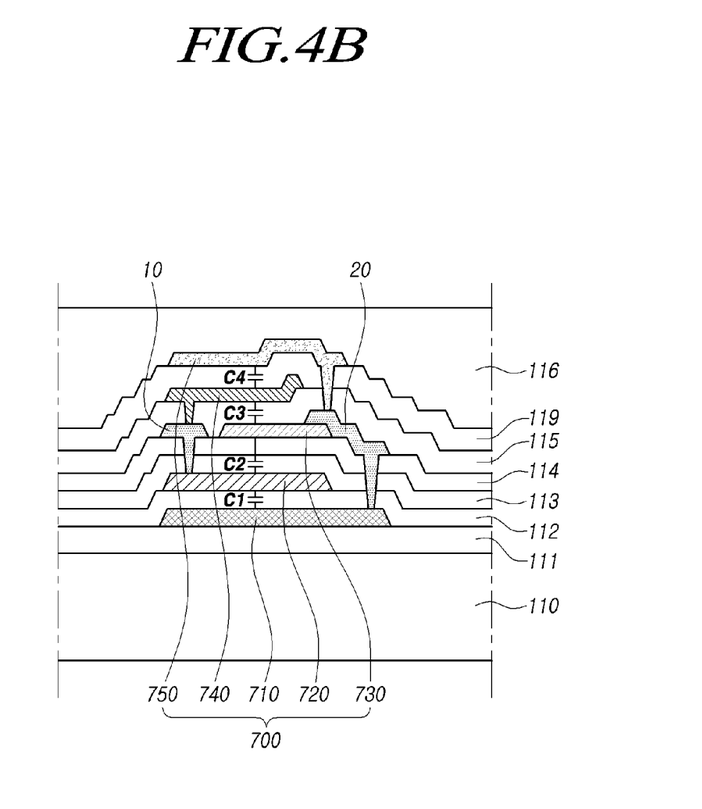
FIG. 4B is a cross-sectional view of a storage capacitor in the subpixel according to another embodiment of the present disclosure.

FIG. 4A is a cross-sectional view illustrating the plurality of thin film transistors and light emitting elements in the subpixel of a display device according to another exemplary embodiment of the present specification. Also, FIG. 4B is a cross-sectional view illustrating the storage capacitor in the subpixel of the display device according to another exemplary embodiment of the present specification. It will be described with reference to FIGS. 3A and 3B, duplicate description will be omitted or briefly described. For example, the substrate 110, the first buffer layer 111, the first gate insulation layer 112, the first interlayer insulation layer 113, the second buffer layer 114, the second gate insulation layer 115, the protective layer 116, the bank layer 117, the spacer 118, the light emitting element 500, the first connection electrode 10, the second connection electrode 20, first thin film transistor 300 and second thin film transistor 400 are substantially the same. Accordingly, duplicate descriptions of the configurations of FIGS. 4A and 4B that are substantially the same as those of FIGS. 3A and 3B are omitted or briefly described.

The display device according to another exemplary embodiment of the present specification may include the first buffer layer 111, the first gate insulation layer 112, the first interlayer insulation layer 113, the second buffer layer 114, and the second gate insulation layer 115, a second interlayer insulation layer 119, the protective layer 116, the bank layer 117, the spacer 118, the light emitting element 500, the first thin film transistor 300, the second thin film transistor 400, the storage capacitor 700, an auxiliary electrode 610, the first connection electrode 10, and the second connection electrode 20.

In the display device according to another exemplary embodiment of the present specification, the storage capacitor 700 includes the first storage electrode 710, the second storage electrode 720, the third storage electrode 730, the fourth storage electrode 740, and a fifth storage electrode 750.

Referring to FIGS. 4A and 4B, in the display device according to another exemplary embodiment of the present specification, the second interlayer insulation layer 119 may be formed on the second gate insulation layer 115, the second gate electrode 440 and the fourth storage electrode 740. The second interlayer insulation layer 119 may include an insulating material. The second interlayer insulation layer 119 may be a single layer made of a silicon nitride (SiNx) layer or a silicon oxide (SiOx) layer. As another example, the second interlayer insulation layer 119 may be formed of multiple layers in which a silicon oxide (SiOx) layer and a silicon nitride (SiNx) layer are alternately formed.

Referring to FIG. 4A, a contact hole exposing the first drain electrode 330 of the first thin film transistor 300 may be formed in the second interlayer insulation layer 119 and the second gate insulation layer 115.

In addition, referring to FIG. 4B, a contact hole exposing the second connection electrode 20 may be formed in the second interlayer insulation layer 119 and the second gate insulation layer 115.

In addition, referring to FIG. 4A, the auxiliary electrode 610 may be formed on the second interlayer insulation layer 119. The auxiliary electrode 610 may include a conductive material. For example, the auxiliary electrode 610 may include a metal such as aluminum (Al), chromium (Cr), copper (Cu), titanium (Ti), molybdenum (Mo), tungsten (W), or alloys thereof. In addition, the auxiliary electrode 610 may be formed of a single layer or multiple layers. The auxiliary electrode 610 may be connected to the first drain electrode 330 of the first thin film transistor 300 exposed through the contact holes of the second interlayer insulation layer 119 and the second gate insulation layer 115. Accordingly, the auxiliary electrode 610 may serve to electrically connect the first thin film transistor 300 and the light emitting element 500.

Referring to FIG. 4B, the fifth storage electrode 750 may be formed on the second interlayer insulation layer 119. The fifth storage electrode 750 may overlap the fourth storage electrode 740 with the second interlayer insulation layer 119 therebetween. Therefore, the fifth storage electrode 750 may overlap the fourth storage electrode 740 to further form the fourth storage capacitor C4. The fifth storage electrode 750 may be made of the same material as the auxiliary electrode 610 and may be disposed on the same layer. In addition, the fifth storage electrode 750 may have the same stacked structure as the auxiliary electrode 610.

The fifth storage electrode 750 may be connected to the second connection electrode 20 exposed through the contact holes in the second interlayer insulation layer 119 and the second gate insulation layer 115. Accordingly, the fifth storage electrode 750, the third storage electrode 730, and the first storage electrode 710 may be electrically connected to each other. Also, the second storage electrode 720 and the fourth storage electrode 740 may be electrically connected. The same first voltage may be supplied to the fifth storage electrode 750, the third storage electrode 730, and the first storage electrode 710. The same second voltage may be supplied to the second storage electrode 720 and the fourth storage electrode 740. In addition, the magnitudes of the first voltage and the second voltage may be different.

In the display device according to the exemplary embodiment of the present specification, the fifth storage electrode 750 may overlap the fourth storage electrode 740 with the second interlayer insulation layer 119 therebetween, and may form the fourth storage capacitor C4 of the storage capacitor 700. As described above, the storage capacitor 700 may be additionally secured by further forming the fourth storage capacitor C4. Accordingly, in a display device requiring the high-capacity storage capacitor, it is possible to increase the capacity of the storage capacitor 700 by forming the fifth storage electrode 750 overlapping the fourth storage electrode 740 with the second interlayer insulation layer 119 therebetween.

As the display device becomes higher in resolution, the area of each subpixel decreases. Therefore, it is difficult to design a high-capacity storage capacitor and a plurality of transistors in each subpixel area reduced. However, in the display device according to an embodiment of the present disclosure, the first storage capacitor C1 may be formed by overlapping the first storage electrode 710 formed on the same layer as the first semiconductor pattern 310 and the second storage electrodes 720 formed on the same layer as the first gate electrode 340. In addition, the second storage capacitor C2 may be further formed by overlapping the second storage electrode 720 and the third storage electrode 730 formed on the same layer as the second semiconductor pattern 410. In addition, the third storage capacitor C3 may be further formed by overlapping the third storage electrode 730 and the fourth storage electrode 740 formed on the same layer as the second gate electrode 440. In addition, the fourth storage capacitor C4 may be further formed by overlapping the fourth storage electrode 740 and the fifth storage electrode 750 formed on the same layer as the auxiliary electrode 610. Therefore, in the high-resolution display device requiring the high-capacity storage capacitor, there is an advantage in that the storage capacitors and a plurality of transistors can be effectively designed within each limited subpixel.

Referring to FIGS. 4A and 4B, the protective layer 116 may be formed on the auxiliary electrode 610, the fifth storage electrode 750, and the second interlayer insulation layer 119. In addition, a contact hole exposing the auxiliary electrode 610 may be formed in the protective layer 116. In addition, a contact hole exposing the fifth storage electrode 750 may be formed.

The first electrode 510 of the light emitting element 500 may be formed on the protective layer 116. In addition, the first electrode 510 may be connected to the auxiliary electrode 610 through the contact hole in the protective layer 116. Accordingly, the light emitting element 500 of each subpixel SP may be electrically connected to the first thin film transistor 300 of the subpixel SP. For example, the first electrode 510 of each subpixel SP may pass through the protective layer 116 and be connected to the auxiliary electrode 610, and the auxiliary electrode 610 may pass through the second interlayer insulation layer 119 and the second gate insulation layer 115 and be electrically connected to the first drain electrode 330 of the first thin film transistor 300. Accordingly, the first electrode 510 of each subpixel SP may be electrically connected to the first thin film transistor 300.

The light emitting element 500 of each subpixel SP may be driven independently. For example, the first electrode 510 of each subpixel SP may be insulated from the first electrode 510 of the adjacent subpixel SP. The edge of each first electrode 510 may be covered by the bank layer 117. The bank layer 117 may be positioned on the protective layer 116. The light emitting layer 520 and the second electrode 530 of each subpixel SP may be stacked on the corresponding first electrode 510 exposed by the bank layer 117. The bank layer 117 may include an insulating material. The spacer 118 may be further disposed on the bank layer 117. In addition, the spacer 118 may be formed of the same material as the bank layer 117.

In addition, the light emitting layer 520 of the light emitting element 500 may be further disposed on the first electrode 510. The light emitting layer 520 may be formed on the first electrode 510 in the order of the hole layer HL, the light emitting material layer EML, and the electron layer EL or in the reverse order.

At least a portion of the light emitting layer 520 of each subpixel SP may extend on the bank layer 117. For example, the hole layer HL and the electron layer EL of each subpixel SP may be connected to the hole layer HL and the electron layer EL of the adjacent subpixel SP. The light emitting material layer EML of each subpixel SP may be spaced apart from the light emitting material layer EML of the adjacent subpixel SP. The second electrode 530 of each subpixel SP may extend on the bank layer 117. For example, the second electrode 530 of each subpixel SP may be connected to the second electrode 530 of the adjacent subpixel SP.

In addition, the encapsulation member that inhibits moisture penetration may be further disposed on the second electrode 530.

The display device according to an embodiment of the present disclosure may include a first buffer layer on a substrate; a first thin film transistor including a first semiconductor pattern disposed on the first buffer layer and comprising poly-silicon, a first gate electrode overlapping the first semiconductor pattern with a first gate insulation layer interposed therebetween, and a first source electrode and a first drain electrode connected to the first semiconductor pattern; a first interlayer insulation layer on the first gate electrode; a second buffer layer on the first interlayer insulation layer; a second thin film transistor including a second semiconductor pattern disposed on the second buffer layer and comprising an oxide semiconductor, a second source electrode and a second drain electrode on the second semiconductor pattern, and a second gate electrode overlapping the second source electrode and the second drain electrode with a second gate insulation layer therebetween; and a storage capacitor including a first storage electrode disposed on the first buffer layer and made of the same material as the first semiconductor pattern, a second storage electrode made of the same material as the first gate electrode and overlapping the first storage electrode with the first gate insulation layer interposed therebetween, a third storage electrode made of the same material as the second semiconductor pattern and overlapping the second storage electrode with the second buffer layer and the first interlayer insulation layer interposed therebetween, and a fourth storage electrode made of the same material as the second gate electrode and overlapping the third storage electrode with the second gate insulation layer interposed therebetween.

According to the embodiment of the present disclosure, the second source electrode and the second drain electrode may be disposed between the second gate electrode and the second semiconductor pattern.

According to the embodiment of the present disclosure, the second source electrode contacts an upper surface and side surfaces of one side of the second semiconductor pattern, and the second drain electrode contacts an upper surface and side surfaces of the other side of the second semiconductor pattern.

According to the embodiment of the present disclosure, the second source electrode may be disposed spaced apart by a first width from the second drain electrode on the upper surface of the second semiconductor pattern.

According to the embodiment of the present disclosure, the second gate electrode has a second width greater than the first width.

According to the embodiment of the present disclosure, the first storage electrode may include the same stacked structure as the first semiconductor pattern, and the second storage electrode has the same stacked structure as the first gate electrode.

According to the embodiment of the present disclosure, the first source electrode and the second drain electrode may be integrally connected to each other.

According to the embodiment of the present disclosure, the display device may further comprise a second interlayer insulation layer on the second gate electrode, the fourth storage electrode and the first gate insulation layer.

According to the embodiment of the present disclosure, the storage capacitor may further include a fifth storage electrode overlapping the fourth storage electrode with the second interlayer insulation layer therebetween.

According to the embodiment of the present disclosure, an auxiliary electrode made of the same material as the fifth storage electrode may be connected to the first drain electrode.

The display device according to another embodiment of the present disclosure may include a first buffer layer on a substrate; a first thin film transistor including a first semiconductor pattern disposed on the first buffer layer and including a first semiconductor, a first gate electrode overlapping the first semiconductor pattern with a first gate insulation layer interposed therebetween, and a first source electrode and a first drain electrode connected to the first semiconductor pattern; a first interlayer insulation layer on the first gate electrode; a second buffer layer on the first interlayer insulation layer; a second thin film transistor including a second semiconductor pattern disposed on the second buffer layer and including a second semiconductor different from the first semiconductor, a second source electrode and a second drain electrode on the second semiconductor pattern, and a second gate electrode overlapping the second source electrode and the second drain electrode with a second gate insulation layer therebetween; and a storage capacitor including a first storage electrode disposed on the first buffer layer and made of the same material as the first semiconductor pattern, a second storage electrode made of the same material as the first gate electrode and overlapping the first storage electrode with the first gate insulation layer interposed therebetween, a third storage electrode made of the same material as the second semiconductor pattern and overlapping the second storage electrode with the second buffer layer and the first interlayer insulation layer interposed therebetween, and a fourth storage electrode made of the same material as the second gate electrode and overlapping the third storage electrode with the second gate insulation layer interposed therebetween.

According to another embodiment of the present disclosure, the first source electrode, the first drain electrode, the second source electrode, and the second drain electrode may be disposed on the same layer.

According to another embodiment of the present disclosure, the fourth storage electrode and the second gate electrode may be disposed on the same layer.

According to another embodiment of the present disclosure, the first source electrode and the second drain electrode may be integrally connected to each other.

According to another embodiment of the present disclosure, the second source electrode and the second drain electrode may be disposed between the second gate electrode and the second semiconductor pattern.

According to another embodiment of the present disclosure, the fourth storage electrode may be electrically connected to the second storage electrode.

According to another embodiment of the present disclosure, the display device may further comprise a second interlayer insulation layer disposed on the fourth storage electrode and the second gate electrode, and the storage capacitor may further include a fifth storage electrode overlapping the fourth storage electrode with the second interlayer insulation layer therebetween.

According to another embodiment of the present disclosure, the fifth storage electrode, the third storage electrode, and the first storage electrode may be electrically connected.

What is claimed is:
1. A display device comprising:
a first thin film transistor including a first semiconductor pattern disposed on a substrate and, a first gate electrode overlapping the first semiconductor pattern with a first gate insulation layer interposed therebetween and disposed over the first semiconductor pattern in a cross-sectional view of the display device, and a first source electrode and a first drain electrode connected to the first semiconductor pattern;
a middle layer on the first gate electrode;
a second thin film transistor including a second semiconductor pattern disposed on the middle layer and comprising an oxide semiconductor, a second source electrode and a second drain electrode on the second semiconductor pattern, and a second gate electrode overlapping the second semiconductor pattern and disposed over the second semiconductor pattern in the cross-sectional view;
a light emitting element including a first electrode and a second electrode corresponding to the first electrode and a light emitting layer between the first electrode and the second electrode;
an auxiliary electrode connecting the first thin film transistor to the light emitting element;
a storage capacitor including a first storage electrode disposed on a same layer and comprising a same material as the first semiconductor pattern, a second storage electrode comprising a same material as the first gate electrode and overlapping the first storage electrode with the first gate insulation layer interposed therebetween, a third storage electrode disposed in a same layer and comprising a same material as the second semiconductor pattern and overlapping the second storage electrode with the middle layer interposed therebetween, and a fifth storage electrode disposed in a same layer and comprising a same material as the auxiliary electrode and overlapping the third storage electrode; and
a second gate insulation layer interposed between the second gate electrode and the second semiconductor pattern and covering at least a portion of a top surface of the third storage electrode.

2. The display device of claim 1, further comprising:
a first buffer layer on the substrate,
wherein the first semiconductor pattern and the first storage electrode are disposed on the first buffer layer.

3. The display device of claim 1, wherein the middle layer comprises:
a first interlayer insulation layer on the first gate electrode; and
a second buffer layer on the first interlayer insulation layer,
wherein the third storage electrode is disposed on the second buffer layer.

4. The display device of claim 1, wherein the first thin film transistor is a P-type transistor, and the second thin film transistor is a N-type transistor.

5. The display device of claim 1, wherein the first storage electrode has a same stacked structure as the first semiconductor pattern, and the second storage electrode has a same stacked structure as the first gate electrode.

6. The display device of claim 1, wherein the first source electrode and the second drain electrode are integrally connected to each other.

7. The display device of claim 1, wherein the auxiliary electrode is connected to the first drain electrode and the first electrode.

8. The display device of claim 1, wherein the second gate insulation layer comprises silicon oxide.

9. The display device of claim 1, wherein a lower surface of the second gate insulation layer is directly in contact with an upper surface of the first source electrode and an upper surface of the first drain electrode of the first thin film transistor.

10. The display device of claim 1, wherein the second gate insulation layer that is between the second gate electrode and second semiconductor pattern is disposed between the auxiliary electrode and the first source electrode and the first drain electrode of the first thin film transistor in the cross-sectional view of the display device.

11. The display device of claim 1, wherein the storage capacitor further includes a second connection electrode electrically connecting the first storage electrode to the third storage electrode.

12. The display device of claim 11, wherein the second connection electrode comprises a same material as at least one of the second source electrode and the second drain electrode.

13. The display device of claim 11, wherein the fifth storage electrode is electrically connected to the second connection electrode.

14. The display device of claim 13, further comprising:
a fourth storage electrode between the third storage electrode and the fifth storage electrode,
wherein the fourth storage electrode is electrically connected to the second storage electrode.

15. A display device comprising:
a first thin film transistor including a first semiconductor pattern disposed on a substrate, a first gate electrode overlapping the first semiconductor pattern with a first gate insulation layer interposed therebetween and disposed over the first semiconductor pattern in a cross-sectional view of the display device, and a first source electrode and a first drain electrode connected to the first semiconductor pattern;
a middle layer on the first gate electrode;
a second thin film transistor including a second semiconductor pattern disposed on the middle layer, a second source electrode and a second drain electrode on the second semiconductor pattern, and a second gate electrode overlapping the second semiconductor pattern and disposed over the second semiconductor pattern in the cross-sectional view;
a light emitting element including a first electrode and a second electrode corresponding to the first electrode and a light emitting layer between the first electrode and the second electrode; and
a storage capacitor including a first storage electrode disposed on a same layer and comprising a same material as the first semiconductor pattern, a second storage electrode comprising a same material as the first gate electrode and overlapping the first storage electrode with the first gate insulation layer interposed therebetween, a third storage electrode disposed in a same layer as the second semiconductor pattern, and overlapping the second storage electrode with the middle layer interposed therebetween, and a fourth storage electrode disposed on an interlayer insulation layer disposed on the second gate electrode while overlapping the third storage electrode; and
a second gate insulation layer interposed between the second gate electrode and the second semiconductor pattern and covering at least a portion of a top surface of the third storage electrode.

16. The display device of claim 15, wherein the first semiconductor pattern comprises poly-silicon and the second thin film transistor comprises an oxide semiconductor.

17. The display device of claim 15, wherein the third storage electrode comprises a same material as the second semiconductor pattern.

18. The display device of claim 15, further comprising:
a first buffer layer on the substrate,
   wherein the first semiconductor pattern and the first storage electrode are disposed on the first buffer layer.

19. The display device of claim 15, wherein the middle layer comprises:
   a first interlayer insulation layer on the first gate electrode; and
   a second buffer layer on the first interlayer insulation layer,
   wherein the third storage electrode is disposed on the second buffer layer.

20. The display device of claim 15, wherein the storage capacitor further includes a connection electrode electrically connecting the first storage electrode to the third storage electrode.

* * * * *